United States Patent [19]

Ali et al.

[11] Patent Number: 4,921,827
[45] Date of Patent: May 1, 1990

[54] SENSITIZED PHOTOINITIATOR SYSTEM FOR ADDITION POLYMERIZATION

[75] Inventors: Mohammad Z. Ali, Woodbury; Stanley C. Busman, Minneapolis, both of Minn.

[73] Assignee: Minnesota Mining and Manufacturing Company, St. Paul, Minn.

[21] Appl. No.: 275,515

[22] Filed: Nov. 23, 1988

[51] Int. Cl.$^5$ ............................................. C08F 4/00
[52] U.S. Cl. ................................... 502/167; 430/281
[58] Field of Search ........................ 502/167; 430/281

[56] References Cited

U.S. PATENT DOCUMENTS

| | | | |
|---|---|---|---|
| 3,961,961 | 6/1976 | Rich | 430/281 X |
| 4,257,915 | 3/1981 | Eaton | 502/167 X |
| 4,278,751 | 7/1981 | Specht et al. | 430/281 |
| 4,791,045 | 12/1988 | Mitra et al. | 430/281 |
| 4,792,506 | 12/1988 | DeVoe et al. | 430/281 |

FOREIGN PATENT DOCUMENTS 0276016  7/1988  European Pat. Off. .

OTHER PUBLICATIONS

"Colloids and Surfaces in Reprographic Technology," T. L. Penner and D. Mobius, ACS Symposium Series 200, M. Hair and M. D. Croucher, Eds. 1982, pp. 111–122.
U.S. Patent Application Ser. No. 07/034,065, filed Apr. 2, 1987.

Primary Examiner—Patrick P. Garvin
Attorney, Agent, or Firm—Donald M. Sell; Walter N. Kirn; Mark A. Litman

[57] ABSTRACT

A visible light sensitive free radical polymerization photoinitiator composition comprising (a) an initiator selected from diaryl iodonium salts, halogenated triazines, and triaryl sulfonium salts having a reduction potential in the range 0.0 to −1.5 eV, and (b) at least one merocyanine sensitizer containing a constrained alkylamino group.

These initiator compositions give high speed polymerization reactions with ethylenically unsaturated monomers and oligomers.

17 Claims, No Drawings

SENSITIZED PHOTOINITIATOR SYSTEM FOR ADDITION POLYMERIZATION

CROSS-REFERENCE TO RELATED CASES

U.S. patent application Ser. No. 34,065 filed 4/4/87 on sensitized iodonium salts for addition polymerization, discloses and claims the use of sensitizers which are ketones containing julolidinyl moieties in the presence of electron donor compounds.

BACKGROUND TO THE INVENTION

1. Field of Invention

This invention relates to sensitizers for photopolymerizable compositions. More particularly, this invention relates to achieving high speed addition polymerization of ethylenically unsaturated monomers and oligomers by the use of merocyanine sensitizers in combination with photoinitiators such as diaryl iodonium salts, triaryl sulfonium salts, and trichloromethyl-s-triazines.

2. Background of the Art

Compounds capable of generating free radicals upon exposure to light, which initiate polymerization, are well known in the art ("Photopolymerization of Surface Coatings", C. G. Roffey, Wiley-Interscience Publications, 1982, pages 67–136). However, the utility of many of these photoinitiators or photoinitiator systems are quite limited because the initiators are activatible primarily in the ultraviolet region of the spectrum. For example, sulfonium and iodonium salt photoinitiators are known to absorb ultraviolet light only at wavelengths below about 300 nm, and trichloromethyl-s-triazines absorbs light below 350 nm.

Various investigations have been carried out in order to broaden the spectral response of photoinitiators. To achieve this, researchers have added compounds which absorb incident light more efficiently and then activate the photoinitiator to produce free radicals. These compounds which absorb the incident light more efficiently are generally termed as sensitizers or photosensitizers.

U.S. Pat. No. 3,729,313 describes sensitizers for diaryliodonium compounds for free radical polymerization. Sensitizers are included from the class of diphenylmethane, xanthane, acridine, methine and polymethine, thiazole, thiazine, azine, aminoketone, porphyrin, colored aromatic polycyclic hydrocarbons, p-substituted aminostyryl compounds and aminotriaryl methanes.

Japanese patent J6 0,088,005 (Agency of Ind. Sci. Tech.) discloses 3-ketocoumarin compounds as sensitizers for diaryliodonium compounds.

U.S. Pat. No. 4,250,053 describes sensitizers for Iodonium salts and particularly 1,3-diaryl-1-pyrazolines for free radical polymerization.

U.S. Pat. No. 3,617,288 describes sensitizers for halogenated hydrocarbon compounds.

U.S. Pat. No. 4,505,793 describes ketocoumarins as sensitizers for halogenated triazines for free radical polymerization.

While the aforementioned compositions have provided improved photospeed compared to the unsensitized system, there is still a need for a more sensitive photopolymer composition. High photospeed is particularly desirable for projection exposure imaging and imaging by laser scanning techniques.

U.S. Pat. Nos. 4,162,162, 4,268,667, 4,351,893 and European Patent 127,762 disclose sensitizers containing constrained amino-ketone groups for bi-imidazole initiators in addition polymerization. U.S. Pat. No. 4,505,793 discloses constrained coumarin sensitizers for triazine initiators. Amino group containing coumarins and constrained coumarins are also disclosed in U.S. Pat. Nos. 4,278,751, 4,147,552, 4,366,228 and G.B. Patent 2,083,832 for use as triplet sensitizers for cyclo-addition reactions or for use as sensitizers for radical polymerization in combination with arylaminoacetic acids. References of these compounds are also found in Polym. Eng. Sci. 1983, 23, 1022–1024. This article mentions the utility of aminoketocoumarin compounds as sensitizers with alkoxypyridinium salts. Photoreactions of coumarin compounds are also mentioned in J. Org. Chem. 1984, 49, 2705–2708. U.S. Pat. No. 4,250,053 teaches constrained coumarin as a sensitizer of iodonium salt for cationic polymerization.

Although constrained alkylamino ketone sensitizers are known, none of the prior art teaches its use to increase the rate of polymerization when used in combination with iodonium salts or halogenated triazines (however, see below), compared with the non-constrained alkylaminoketone sensitizers. Moreover, increase of photospeed by the incorporation of constrained group (particularly julolidine group) in aminoketone (merocyanine) sensitizers in combination with iodonium salts or halogenated triazines is surprising. For example, U.S. Pat. No. 4,250,053 (3M), examples 18, 20 and 21 teaches that julolidine containing sensitizers (sensitizers 77 and 79), showed slower curing rate than non-constrained sensitizer (sensitizer 72) for epoxy curing.

In U.S. Pat. No. 4,505,793 Fuji describes ketocoumarin sensitizers with halogenated compounds (including triazine) for free radical polymerization. Although no example is given showing the speed enhancement imparted by julolidine containing sensitizers, nevertheless, the following sensitizer is disclosed as one of the preferred sensitizers.

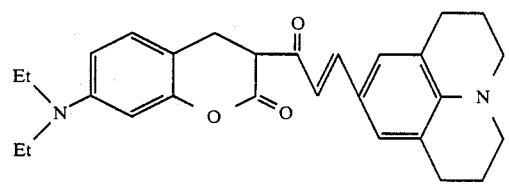

Our measurements on this sensitizer have not shown the speed enhancement found with the sensitizers of the present invention, and we have found that for ketocoumarin sensitizers, the best sensitization is achieved when the julolidine group is on the ketocoumarin ring as shown below:

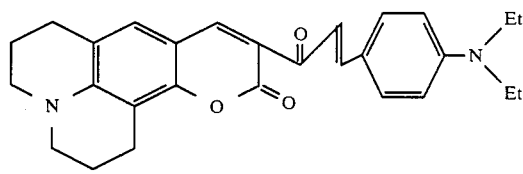

SUMMARY OF THE INVENTION

The invention provides a high sensitivity photopolymerization initiator system for use in a photopolymerizable composition.

The invention also provides a high sensitivity photopolymerization initiator system for use with a polymerizable compound containing an ethylenically unsaturated double bond and provides a high sensitivity photopolymerization initiator sensitive to visible light.

The present invention provides a high sensitivity photopolymerization initiator composition for polymerizing compounds (monomers or oligomers) containing at least one ethylenically unsaturated double bond, said photopolymerization initiator composition comprising (A) a merocyanine sensitizer containing a constrained alkylamino group, said sensitizer having an oxidation potential of 0.5 to 2.0 eV vs a Saturated Calomel Electrode (SCE), and (B) at least one compound selected from diaryliodonium salt, halogenated triazine, and triaryl iodonium salts free radical initiator electron acceptor compounds having a reduction potential of 0 to −1.5 eV vs SCE.

A constrained alkylamino group is defined here as a saturated heterocyclic structure containing at least one nitrogen atom which is directly attached to an existing aromatic ring of the merocyanine; other nitrogens in the heterocyclic structure optionally may be attached to the aromatic ring. The heterocyclic structure may form a condensed ring structure with the aromatic ring or alternatively can be a pyrrolidinyl or diazolyl substituent on the aromatic ring of the merocyanine, with the proviso that when the merocyanine dye is a ketocoumarin a constrained alkylamino group is attached to the ketocoumarin moiety. Such constrained alkylamino groups are chosen from the class of monocyclic, bicyclic or polycyclic amino compounds, such as pyrrolidine, piperidine, julolidine, diazines, diazoles, etc. Particularly preferred is the constrained alkylamino group which with an aromatic group of the merocyanine forms a julolidine group; this generally imparts 2-4 times higher speed compared with non-constrained alkylamino groups.

Selection of the structure of the merocyanine sensitizer moiety can provide high sensitivity to visible light of a desired wavelength range.

DETAILED DESCRIPTION OF THE INVENTION

The improved photoinitiator system of the present invention comprises a free radical photoinitiator having a reduction potential in the range of 0.0 to −1.5 electron Volts selected from the group consisting of triaryl sulfonium salts, diaryl iodonium salts, and halogenated triazines and at least one merocyanine sensitizer containing a constrained alkylamino group, said sensitizer preferably having an oxidation potential in the range of 0.5 to 2.0 eV versus a SCE. These photoinitiator systems are very effectively used in compositions containing ingredients with ethylenically unsaturated groups on monomers, oligomers, and/or polymers.

The merocyanine sensitizing dye compounds of the present invention are arylidine aryl ketones, bis-(p-aminophenyl-α,β-unsaturated)-ketones, aminoketones, coumarins (ketocoumarins) and other merocyanine sensitizers, containing constrained alkylamino groups. Preferred merocyanine sensitizers are selected from those represented by general formulae 1, 2, 3, and 4

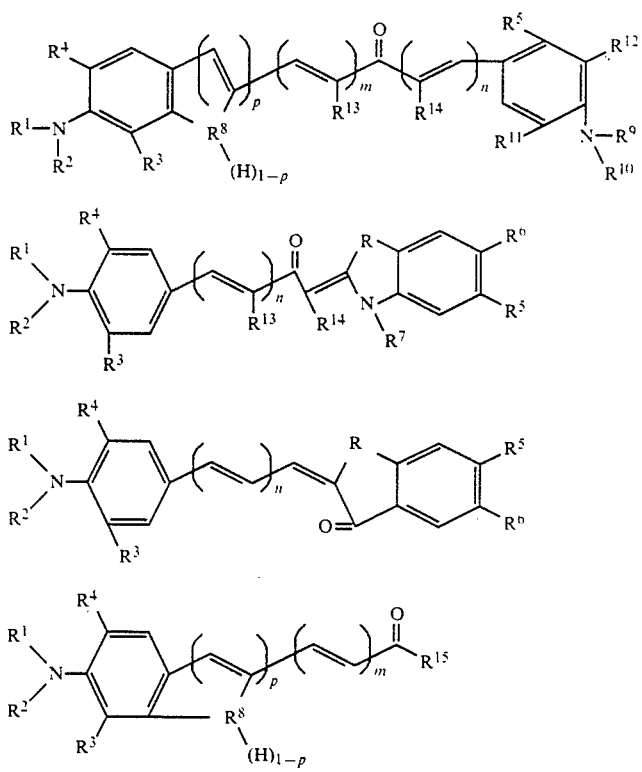

where $R^1$, $R^2$, $R^3$ and $R^4$, are selected from hydrogen, and alkyl groups containing 1 to 10 carbon atoms, and at least one pair of adjacent substituents selected from $R^1$, $R^2$, $R^3$, and $R^4$ together form a 5 or 6 membered heterocyclic ring, provided that if $R^1$ and $R^2$ are selected as the adjacent substituents then the resultant ring is 5 membered (the rings condensed with one of the aromatic rings preferrably form a julolidine moiety); $R^9$, $R^{10}$, $R^{11}$, and $R^{12}$ are selected from hydrogen, and alkyl groups containing 1 to 10 carbon atoms, or one or more adjacent pairs of substituents selected from $R^9$, $R^{10}$, $R^{11}$, $R^{12}$ may together form one or more 5 or 6 membered heterocyclic rings provided that if $R^9$ and $R^{10}$ are selected as the adjacent substituents then the resultant ring is 5 membered, $R^9$ and $R^{10}$ may also be independently chosen from an acid group or salt thereof selected from phosphoric acid, a carboxylic acid, and sulfonic acid, or a group of the form —O—$R^{18}$—W where $R^{18}$ is chosen from a single bond, alkyl, substituted alkyl, aryl, and substituted aryl, and W is a quaternary ammonium moiety, $R^5$ and $R^6$ are each independently hydrogen, an alkoxy group containing from 1 to 6 carbon atoms, an alkyl group from 1 to 4 carbon atoms, a hydroxy group, a halogen atom, a nitro group, an alkyl sulfide group, an alkylamino group, or an acid group or salt thereof selected from phosphoric acid, a carboxylic acid, and sulfonic acid, or a group of the form —O—$R^{18}$—W where $R^{18}$ is chosen from a single bond, alkyl, substituted alkyl, aryl, and substituted aryl, and W is a quaternary ammonium moiety, $R^7$ is an alkyl group containing 1-10 carbon atoms, $R^8$ is an alkyl group from 1-3 carbon atoms (preferrably methylene), or a —OC=O group to form a coumarin ring; $R^{13}$, $R^{14}$ are independently selected from hydrogen, alkyl groups of 1 to 10 carbon atoms, and —$CO_2R^7$, or $R^{13}$ and $R^{14}$ together complete a 5, 6, or 7 membered ring, $R^{15}$ is selected from alkyl containing 1 to 5 carbon atoms, alkoxy containing 1 to 5 carbon atoms, $Ar^3$—, and $Ar^3O$—, where $Ar^3$ is selected from phenyl, substituted phenyl, naphthyl, substituted naphthyl, and a 5 or 6 membered heterocyclic ring containing at least one atom chosen from O, S, and N, p is an integer selected from 0 and 1 with the proviso that when when p is 0 the available methine group is attached in para-position to the amine group and the meta-position to the amine is H or alkyl of 1 to 4 carbon atoms. m and n are integers independently selected from 0, 1, 2, and 3 providing that the sum of m and p is not greater than 3, R is an alkyl or substituted alkyl group, or a heteroatom such as S, O, Se, or =$NR^7$.

Examples of arylidine and arylketone compounds include 2-(9'-julolylidine)-1-indanone, 2-(9'-julolylidine)-5,6-dimethoxy-1-indanone, 2-(4'-N-ethyl-tetrahydroquinolylidine)-1-indanone, 2-(4'-N-ethyl-indolylidine)-1-indanone, 2-(4-N-ethyl-indolylidine)-5,6-dimethoxy-1-indanone, 2-(4'-N-ethyl-tetralydroquinolylidine)-5,6-dimethoxy-1-indanone, 2-(4'-pyrrolidinobenzylidine)-1-indanone, Bis-(p-aminophenyl-α,β-unsaturated) ketone compounds, include 2,6-bis(9'-julolylidine)-cyclohexanone and 2,5-bis(9'-julolidine)-cyclopentanone.

As well as ketones of the formula

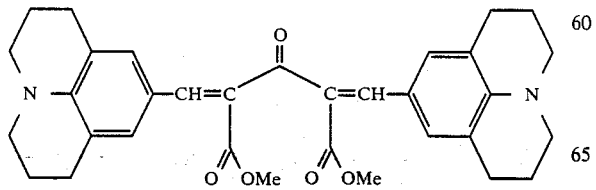

Ketocoumarin compounds include

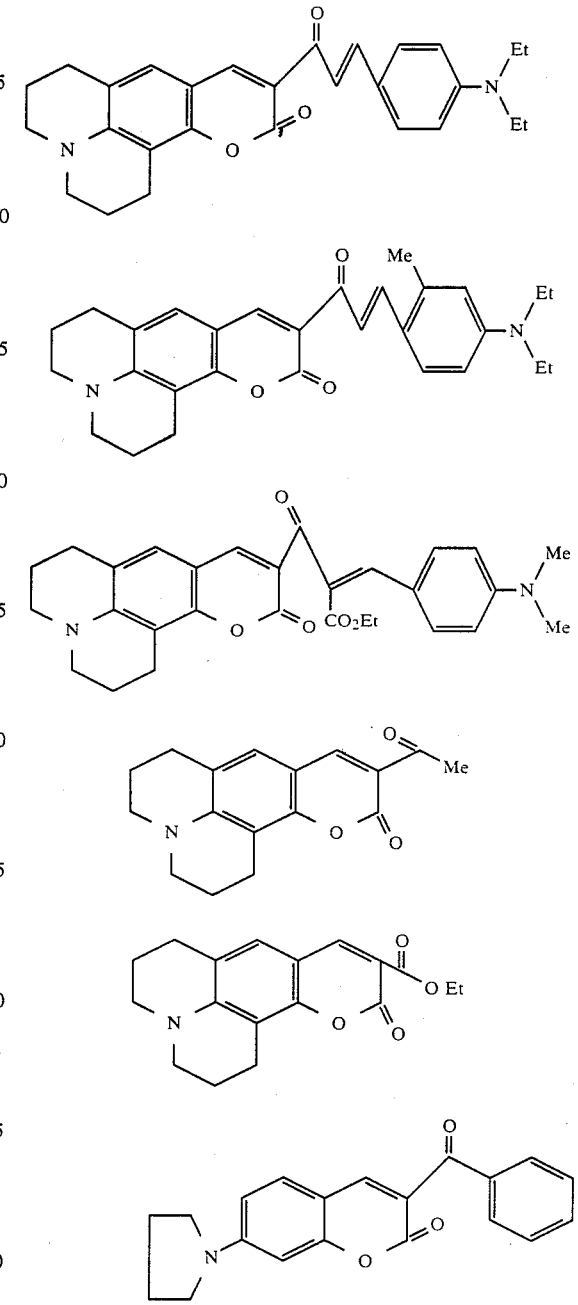

Aromatic iodonium salts which can be sensitized in accordance with this invention are disclosed in U.S. Pat. No. 4,250,053 and have the general formula:

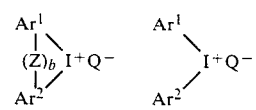

wherein

Ar[1] and Ar[2] are aromatic groups having from 4 to 20 carbon atoms and are preferably selected from phenyl, naphthyl, thienyl, furanyl and pyrazolyl groups, Z is selected from

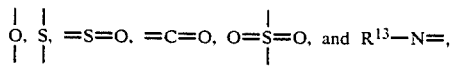

where $R^{13}$ is aryl of 6 to 20 carbon atoms, acyl of 2 to 20 carbon atoms, a single bond, or $=CR^{14}R^{15}$ in which $R^{14}$ and $R^{15}$ are selected from hydrogen, alkyl groups of 1 to 4 carbon atoms, b is zero or one, Q is any anion, preferably a halogen-containing complex anion selected from tetrafluoroborate, hexafluorophosphate, hexafluoroarsenate, and hexafluoroantimonate.

Halogenated hydrocarbon compounds including triazines which can be sensitized in accordance with this invention are disclosed in U.S. Pat. No. 3,617,288. Halogenated triazine compounds substituted by at least one trihalomethyl group are disclosed for example in U.S. Pat. No. 4,505,793 (Fuji) and are represented by the general formula:

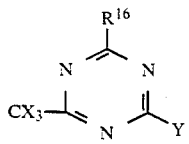

wherein,

X is a halogen atom (preferably chlorine or bromine),

Y is $-CX_3$, $-NH_2$, $-NHR^{17}$, $-NP^{17}_2$, or $-OR^{17}$, wherein $R^{17}$ is an alkyl group of 1 to 4 carbon atoms or an aryl group containing 6 to 10 carbon atoms, and $R^{16}$ is $-CX_3$, an alkyl group of 1 to 12 carbon atoms, a substituted or unsubstituted aryl group of 6 to 12 carbon atoms, an alkenyl group of 2 to 12 carbon atoms, or a substituted or unsubstituted aralkenyl group containing from 8 to 20 carbon atoms.

Any convenient source of actinic radiation providing wavelengths in the region of the spectrum that overlap the absorption bands of the spectral sensitizer dyes can be used to activate the photopolymerization initiator compositions for radical formation, image formation and photopolymerization initiation. The light can be natural or artificial, monochromatic or polychromatic, incoherent or coherent, and for high efficiency should correspond closely in wavelengths to the sensitizers principal absorption bands and should be sufficiently intense to activate a substantial portion of the sensitizer compound.

Conventional light sources include fluorescent lamps, mercury, metal additive, pulsed xenon, and arc lamps providing narrow or broad spectral bands centered near 405, 436 and 546 nm (Hg) wavelengths. Coherent light sources include pulsed xenon chloride, argon ion, and ionized neon lasers. Visible emitting cathode ray tubes widely used in printout systems for writing on photosensitive materials are also useful with the subject compositions.

The free radically polymerizable compound used herein is a compound containing at least one ethylenically unsaturated double bond and this may be a monomer, a prepolymer, i.e., a dimer, a trimer and other oligomers, a mixture thereof, a polymer, or a copolymer. Suitable examples and preferred monomers are listed in U.S. Pat. No. 4,228,232. Suitable examples and preferred oligomers are disclosed in U.S. Pat. No. 4,476,215. The photopolymerizable composition of the invention containing the above-described ethylenic compound and photosensitizer-initiator system may further contain, if desired, known additives such as a binder, a thermal polymerization inhibitor, a plasticizer, a coloring agent and a surface lubricant (U.S. Pat. No. 4,228,232).

The composition of the invention can be used for preparation of coatings for various substrates; however, adhesives, sealants, binders and rubbers can also be prepared from the composition of the invention. (These are described in U.S. Pat. No. 4,250,053, lines 10-18.)

The photopolymerizable composition may contain additives known in the art to alter the properties of the polymerized or cured product (U.S. Pat. No. 4,250,053 lines 19-24).

Photopolymerizable compositions using photopolymerization initiator compositions of the present invention are particularly useful in presensitized printing plates and color proofing systems. The increased speed of the compositions provided by the constrained sensitizers are particularly useful in projection speed and argon ion laser addressable printing plates and color proofing systems.

EXAMPLES

A. Preparation of Sensitizing Dye A.

A mixture of 1.5 g of Compound F and 1.3 g of 4-diethyl aminobenzaldehyde in 50 ml ethanol was heated until the reagents were dissolved. One ml of piperidine was added and the reaction mixture heated under reflux for 7 hr. The solution was allowed to cool to room temperature and then was further cooled in an ice-water bath. The precipitated red solid was filtered and the solid was washed by cold ethanol and water. Upon recrystallization from ethanol 0.9 g of red solid was obtained, having a melting point of 185°-186° C. and $\lambda$ max of 504 nm in methanol.

B. Preparation of Sensitizing Dye R.

A solution of 1.0 g 4'-piperidinoacetophenone and 1.05 g of 9-julolidinecarboxaldehyde in 20 ml of ethanol was warmed until the reagents went into solution. Aqueous sodium hydroxide (25%, 1 ml) was then added and the reaction mixture was heated to reflux for 1 hr. The solution was cooled in an ice bath and the precipitated solid was filtered. The solid was washed with petroleum ether and water and was recrystallized from ethanol to yield 0.7 g of orange-red solid, with a melting point of 149°-150° C. and a $\lambda$ max of 450 nm in methanol.

To test the effectiveness of the compounds as sensitizers with iodonium compounds in a photopolymerizable element, the following stock solution was prepared.

| Component | Amount |
| --- | --- |
| Pentaerythritol tetraacrylate | 4.3 g |
| Oligomer P-II, 61% in MEK (U.S. Pat. No. 4,228,232) | 5.6 g |
| Triethylamine | 0.3 g |
| n-propanol-water azeotrope (78:22, w/w) | 74.2 g |
| Pigment Red 48 (4.1% pigment and 8.2% poly(vinyl formula 12/85 in azeotrope) | 14.9 g |

To 5 g of the above formulation was added 2-6 mg of sensitizer, 20 mg of $Ph_2I^+PF_6^-$ (or tris-trichloromethyl-s-triazine). The solution was then coated with wire wound rods onto grained and anodized aluminum at coating weights of 100-200 mg/ft$^2$ and dried at 150° F. for 2 min. The plate was then top coated with 5% aqueous polyvinyl alcohol containing a small amount of inert surfactant (Triton X-100, 0.03%) as a coating aid and a coating weight of 100-200 mg/ft$^2$. The dried samples were exposed through a $\sqrt{2}$ density increment, 21 step Stouffers sensitivity guide for 2 sec. with a 16,000 foot candle tungsten light source at 10 inches (3M model 70 light source). The exposed plates were developed with an aqueous solution of 4% n-propanol, 2% sodium metasilicate and 0.06% Dowfax TM 2AL surfactant (Dow Chemical Company). The Table shows the number of steps after exposure and development where the polymer was retained. The step values (solid) indicate the exposure level at which the developed image density can no longer be differentiated from the background and is believed to be cured to the desired level. Absolute sensitivity of many of the samples were also measured by exposing with an argon-ion laser (488 nm) or by exposing at the corresponding absorption maximum of the sensitizer with a one KW high-pressure mercury-xenon light source directed through a monochromator with a 20 nm band pass (exposure values in ergs/cm$^2$ required to form one solid step). The lamp output was measured by a radiometer. From the data in the table it is seen that the photosensitivity of photopolymer compositions are in general higher with sensitizers containing constrained julolidine group.

TABLE OF SENSITIZERS

| Sensitizer | Formula |
|---|---|
| A | [structure: julolidine-coumarin with chalcone linked to p-(N,N-diethylamino)phenyl] |
| B | [structure: 7-(N,N-dimethylamino)coumarin with chalcone linked to p-(N,N-diethylamino)phenyl] |
| C | [structure: 7-(N,N-dimethylamino)coumarin with chalcone linked to p-(N,N-dimethylamino)phenyl] |
| D | [structure: julolidine-coumarin with chalcone linked to 2-methyl-4-(N,N-dimethylamino)phenyl] |
| E | [structure: julolidine-coumarin with ethyl ester (–C(O)OC$_2$H$_5$)] |

TABLE OF SENSITIZERS -continued
| Sensitizer | Formula |
|---|---|
| F |  |
| G | 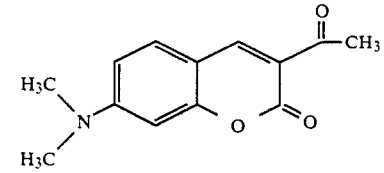 |
| H | 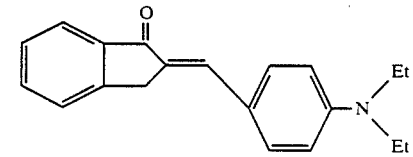 |
| I | 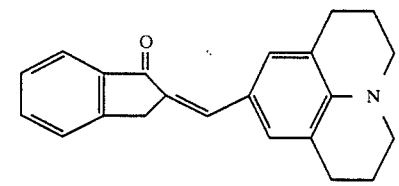 |
| J | 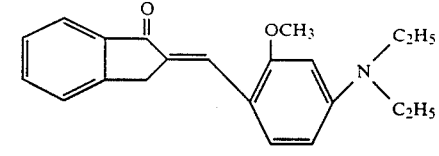 |
| K | 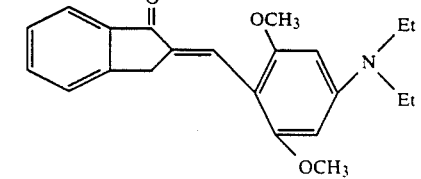 |
| L | 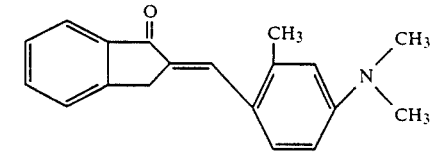 |
| M | 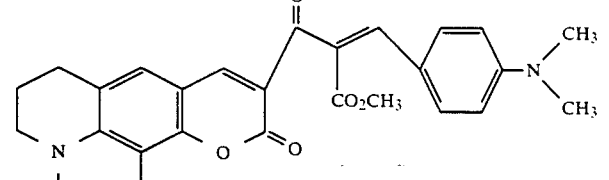 |

-continued
TABLE OF SENSITIZERS

| Sensitizer | Formula |
|---|---|
| N | (structure: coumarin with 4-(NMe2) substituent, chalcone linked to 4-dimethylaminophenyl) |
| O | (structure: julolidine-fused coumarin with chalcone linked to 4-dimethylaminophenyl) |
| P | (structure: coumarin with 4-(NMe2), chalcone linked to 4-diethylaminophenyl) |
| Q | (structure: julolidine-fused coumarin with CH2CO2CH3 substituent) |
| R | (structure: 4-pyrrolidinophenyl ketone linked via vinyl to julolidine) |

TABLE OF EXAMPLES

| Example | Sensitizer | λmax nm | Amount | Steps | Abs. Sensitivity (erg/cm²) |
|---|---|---|---|---|---|
| 1 | A | 504 | 3 mg | 14 | 1400 (488 nm) |
| 2 | B | 480 | 3 mg | 13 | 2100 (488 nm) |
| 3 | C | 475 | 3 mg | 9 | 8000 (488 nm) |
| 4 | D | 490 | 3 mg | 13 | 1600 (488 nm) |
| 5 | E | 435 | 5 mg | 16 | 500 (435 nm) |
| 6 | F | 452 | 5 mg | 13 | — |
| 7 | 6 | 436 | 5 mg | 9 | — |
| 8 | H | 439 | 5 mg | 12 | |
| 9 | I | 460 | 5 mg | 15 | |
| 10 | J | 488 | 5 mg | 10 | |
| 11 | K | 427 | 5 mg | 12 | |
| 12 | L | 438 | 5 mg | 12 | |
| 13 | M | 465 | 3 mg | 12 | 2500 |
| 14 | N | 450 | 3 mg | 9 | — |
| 15 | O | 504 | 3 mg | 13 | 1600 |
| 16 | P | 470 | 3 mg | 11 | 3500 |
| 17 | Q | 450 | 3 mg | 12 | — |
| 18 | R | 450 | 5 mg | 13 | 1600 |

EXAMPLES 13–18, TRIAZINE INITIATOR

Preferred merocyanine sensitizers of the present invention are those which contain at least one of the following central nuclei or segment

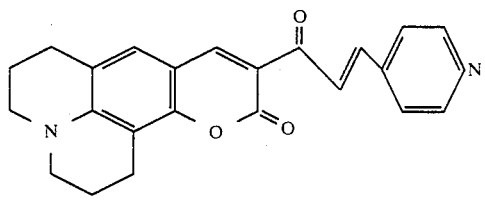

1.

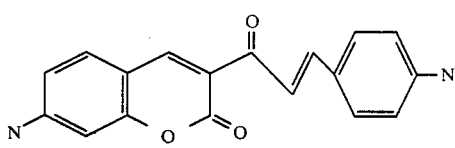

2.

15

-continued

3.
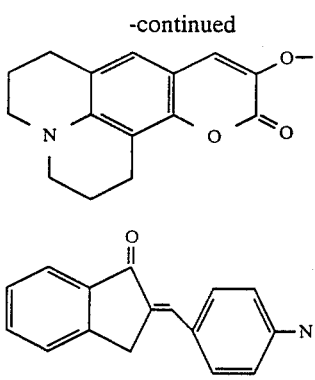

4.

These central nuclei may contain substituent groups and ring structures which are common to merocyanine dyes. The amine nitrogens may, for example, bear alkyl group or phenyl group substituents, or be ring N atoms in cyclic structures such as those in merocyanine sensitizer I. The methine chain may be substituted with aliphatic groups including carboxylic estes (as in M), and the phenyl rings may be variously substituted as with halogen, alkoxy, alkyl, cyano, hydroxy and the like.

As is well understood in this technical area, a large degree of substitution is not only tolerated, but is often advisable. As simplifying the discussion and recitation of these groups, the terms "group" and "moiety" are used to differentiate between chemical species that allow for substitution or which may be substituted. For example, the phrase "alkyl group" is intended to include not only pure hydrocarbon alkyl chains such as methyl, ethyl, propyl, cyclohexyl, isooctyl, tert-butyl and the like, but also such alkyl chains bearing such conventional substituents in the art such as hydroxyl, alkoxy, phenyl, halo (F, Cl, Br, I), cyano, nitro, amino, etc. The phase "alkyl moiety" on the other hand is limited to the inclusion of only pure hydrocarbon alkyl chains such as methyl, ethyl, propyl, cyclohexyl, isooctyl, tert-butyl, and the like.

What we claim is:

1. A free radical photopolymerization initiator composition comprising
   (a) an initiator having a reduction potential in the range 0.0 to $-1.5$ eV selected from the group consisting of photosensitive iodonium salts, sulfonium salts, and halomethyls-triazines, and
   (b) at least one merocyanine sensitizer containing a constrained alkylamino group.

2. An initiator composition as recited in claim 1 wherein said sensitizer has a oxidation potential in the range 0.5 to 2.0 eV.

3. An initiator composition as recited in claim 1 wherein said initiator is selected from diaryl iodonium salts and halomethyls-triazines.

4. An initiator composition as recited in claim 1 wherein said constrained alkylamino group is selected from the group consisting of monocyclic, bicyclic, and polycyclic amino compounds.

5. An initiator composition as recited in claim 1 wherein said constrained alkylamino group is selected from the group consisting of pyrrolidines, piperidines, and julolidines.

6. An initiator composition as recited in claim 1 wherein said constrained alkylamino group is julolidine.

7. An initiator composition as recited in claim 1 wherein said merocyanine sensitizer is selected from the group with one of the general structures 1, 2, 3, and 4

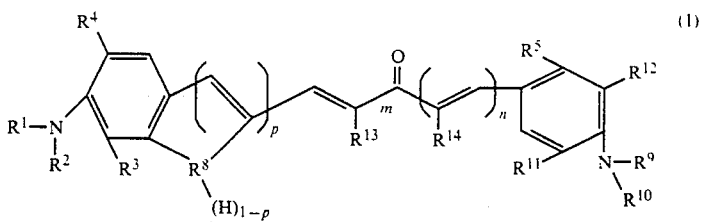

(1)

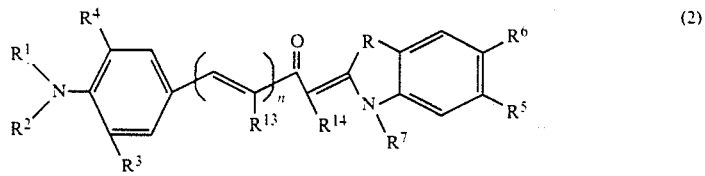

(2)

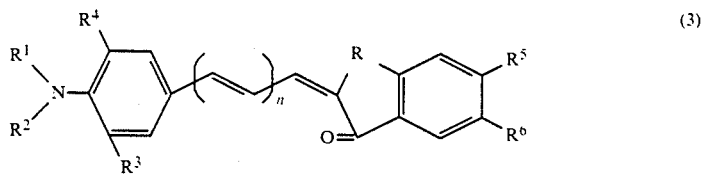

(3)

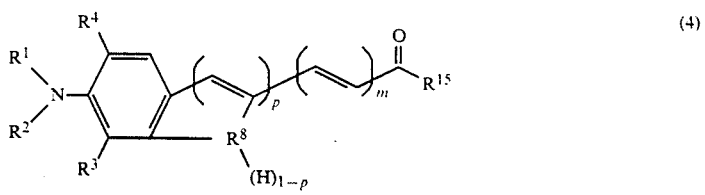

(4)

where $R^1$, $R^2$, $R^3$, and $R^4$, are selected from hydrogen, alkyl, and alkylamino groups, wherein the alkyl groups containing 1 to 10 carbon atoms, and at least one pair of adjacent substituents selected from $R^1$, $R^2$, $R^3$, and $R^4$ together form a 5 or 6 membered heterocyclic ring provided that if $R^1$ and $R^2$ are selected as said adjacent substituents then the resultant ring is 5 membered, $R^9$, $R^{10}$, $R^{11}$, and $R^{12}$ are selected from hydrogen, and alkyl groups containing 1 to 10 carbon atoms, or one or more adjacent pairs of substituents selected from $R^9$, $R^{10}$, $R^{11}$, $R^{12}$ may together form one or more 5 or 6 membered heterocyclic ring provided that if $R^9$ and $R^{10}$ are selected as adjacent substituent then the resultant ring is 5 membered, $R^5$ and $R^6$ are each independently hydrogen, an alkoxy group containing from 1 to 6 carbon atoms, an alkyl group from 1 to 4 carbon atoms, a hydroxy group, a halogen atom, a nitro group, an alkyl sulfide group, or an alkylamino group, $R^7$ is an alkyl group containing 1-10 carbon atoms, $R^8$ is an alkyl group from 1-3 carbon atoms, or a $-OC=O$ group to form a coumarin ring; $R^{13}$, $R^{14}$ are independently selected from hydrogen, alkyl groups of 1 to 10 carbon atoms, and $-CO_2R^7$, or $R^{13}$ and $R^{14}$ together complete a 5, 6, or 7 membered ring, $R^{15}$ is selected from alkyl containing 1 to 5 carbon atoms, alkoxy containing 1 to 5 carbon atoms, $Ar^3-$, and $Ar^3O-$, where $Ar^3$ is selected from phenyl, substituted phenyl, naphthyl, and substituted naphthyl, p is an integer selected from 0 and 1 with the proviso that when p is 0 the available methine group is attached in para-position to the amine and the meta-position to the amine is H or alkyl of 1 to 4 carbon atoms, m and n are integers independently selected from 0, 1, 2, and 3 providing that the sum of m and p is not greater than 3, R is an alkyl or substituted alkyl group, or a heteroatom selected from the group consisting of S, O, Se, or $=NR^7$.

8. An initiator composition as recited in claim 3 wherein said diaryl iodonium salt has the general structure

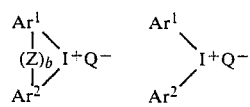

wherein
$Ar^1$ and $Ar^2$ are aromatic groups having from 4 to 20 carbon atoms,
Z is selected from

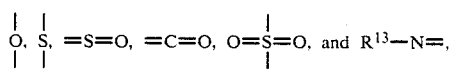

where $R^{13}$ is aryl of 6 to 20 carbon atoms, acyl of 2 to 20 carbon atoms, a single bond, or $=CR^{14}R^{15}$ in which $R^{14}$ and
$R^{14}$ are selected from hydrogen, alkyl groups of 1 to 4 carbon atoms,
b is zero or one,
Q is an anion.

9. A free radical photopolymerization initiator composition comprising
(a) an initiator having a reduction potential in the range 0.0 to $-1.5$ eV selected from the group consisting of halomethyl-s-triazines, and (b) at least one merocyanine sensitizer containing a constrained alkylamino group wherein said sensitizer has a oxidation potential in the range 0.5 to 2.0 eV, and
wherein said halomethyl-s-triazine is selected from those with the general structure

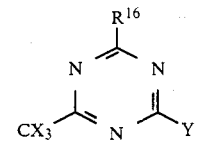

wherein,
X is a halogen atom,
Y is $-CX_3$, $-NH_2$, $-NHR^{15}$, $-NR^{15}_2$, or $-OR^{15}$, wherein $R^{15}$ is an alkyl group of 1 to 4 carbon atoms or an aryl group containing 6 to 10 carbon atoms, and
$R^{16}$ is $-CX_3$, an alkyl group of 1 to 12 carbon atoms, an aryl group of 6 to 12 carbon atoms, an alkenyl group of 2 to 12 carbon atoms, or an aralkenyl group containing from 8 to 20 carbon atoms.

10. The initiator system of claim 1 wherein said sensitizer is a compound having a segment or central nucleus of a formula selected from the group consisting of

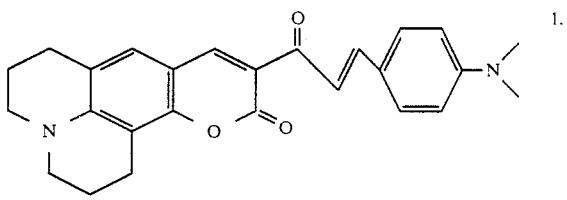

and

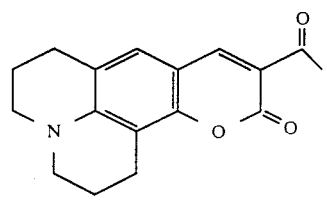

11. The initiator system of claim 2 wherein said sensitizer is a compound having a segment or central nucleus of a formula selected from the group consisting of

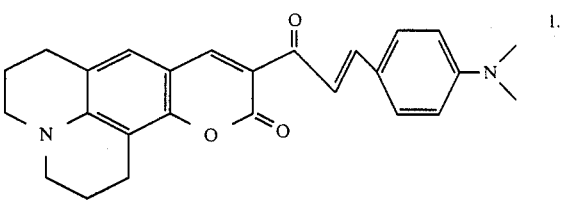

and

-continued

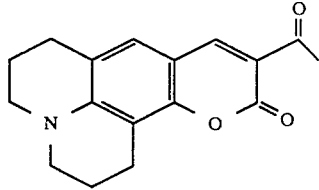

12. The initiator system of claim 3 wherein said sensitizer is a compound having a segment or central nucleus of a formula selected from the group consisting of

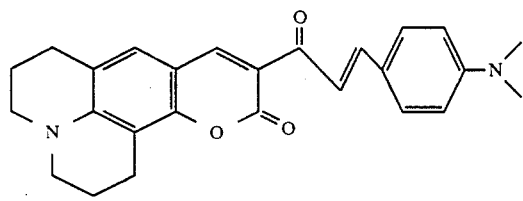

and

13. The initiator system of claim 8 wherein said sensitizer is a compound having a segment or central nucleus of a formula selected from the group consisting of

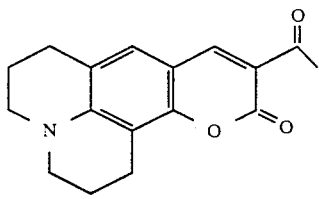

-continued and

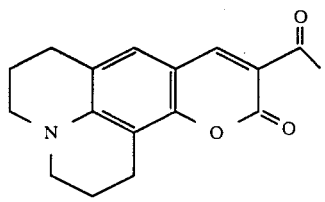

14. The initiator system of claim 9 wherein said sensitizer is a compound having a segment or central nucleus of a formula selected from the group consisting of

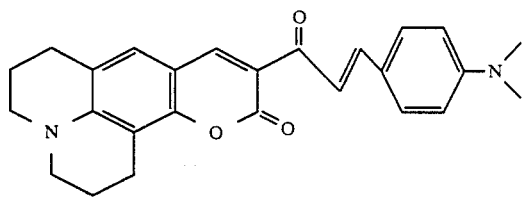

and

15. An initiator composition as recited in claim 9 wherein said constrained alkylamino group is selected from the group consisting of monocyclic, bicyclic, and polycyclic amino compounds.

16. An initiator composition as recited in claim 9 wherein said constrained alkylamino group is selected from the group consisting of pyrrolidines, piperidines, and julolidines.

17. An initiator composition as recited in claim 9 wherein said constrained alkylamino group is julolidine.

* * * * *

UNITED STATES PATENT AND TRADEMARK OFFICE
CERTIFICATE OF CORRECTION

PATENT NO. : 4,921,827

DATED : May 1, 1990

INVENTOR(S) : Ali and Busman

It is certified that error appears in the above-identified patent and that said Letters Patent is hereby corrected as shown below:

Column 16, claim 1, line 12, "halomethyls-triazines" should be --halomethyl-s-triazines--.

Column 16, claim 3, line 20, "halomethyls-triazines" should be --halomethyl-s-triazines--.

Signed and Sealed this

Twenty-ninth Day of October, 1991

Attest:

HARRY F. MANBECK, JR.

Attesting Officer

Commissioner of Patents and Trademarks